(12) United States Patent  
Eaton

(10) Patent No.: US 7,782,080 B2  
(45) Date of Patent: Aug. 24, 2010

(54) HIGH CAPACITIVE LOAD AND NOISE TOLERANT SYSTEM AND METHOD FOR CONTROLLING THE DRIVE STRENGTH OF OUTPUT DRIVERS IN INTEGRATED CIRCUIT DEVICES

(75) Inventor: Steve Eaton, Colorado Springs, CO (US)

(73) Assignee: ProMOS Technologies Pte.Ltd., Singapore (SG)

( * ) Notice: Subject to any disclaimer, the term of this patent is extended or adjusted under 35 U.S.C. 154(b) by 8 days.

(21) Appl. No.: 12/207,179

(22) Filed: Sep. 9, 2008

(65) Prior Publication Data

US 2010/0060315 A1 Mar. 11, 2010

(51) Int. Cl.
*H03K 17/16* (2006.01)

(52) U.S. Cl. .................. 326/30; 326/87; 327/108
(58) Field of Classification Search ............. 326/30, 326/83, 86, 87; 327/108, 109
See application file for complete search history.

(56) References Cited

U.S. PATENT DOCUMENTS

| 5,666,078 | A  | * | 9/1997  | Lamphier et al. ............ 327/108 |
| 6,307,791 | B1 | * | 10/2001 | Otsuka et al. ............ 365/189.05 |
| 6,661,250 | B2 | * | 12/2003 | Kim et al. ................... 326/30 |
| 6,919,738 | B2 |   | 7/2005  | Kushida |
| 2007/0089440 | A1 | | 4/2007 | Singh et al. |

* cited by examiner

*Primary Examiner*—Daniel D Chang  
(74) *Attorney, Agent, or Firm*—William J. Kubida; Peter J. Meza; Hogan Lovells US LLP

(57) ABSTRACT

An output driver calibration circuit includes a programmable drive strength output pullup driver including a strongest transistor and a number of other transistors, a programmable drive strength output pulldown driver including a strongest transistor and a number of other transistors, and a calibration circuit for generating a number of control signals for controlling the transistors in the output pullup driver and the transistors in the output pulldown driver, wherein the control signals are generated simultaneously, except for two the strongest driver transistors.

28 Claims, 12 Drawing Sheets

| Fig. 5A |
|---|
| Fig. 5B |

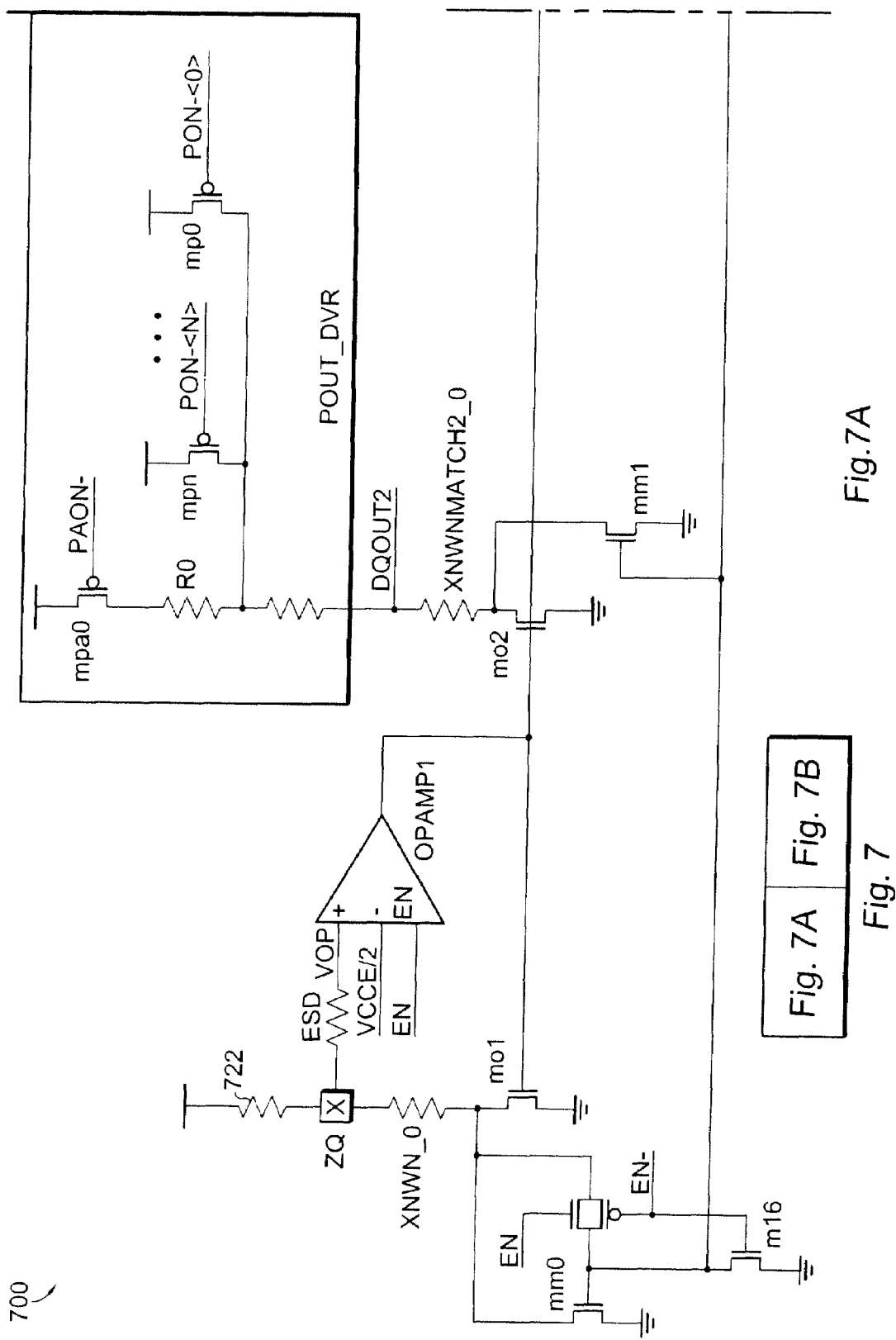

HIGH CAPACITIVE LOAD AND NOISE TOLERANT SYSTEM AND METHOD FOR CONTROLLING THE DRIVE STRENGTH OF OUTPUT DRIVERS IN INTEGRATED CIRCUIT DEVICES

BACKGROUND OF THE INVENTION

The present invention is related to integrated circuit devices having an output driver section, and more particularly to a circuit and method for calibrating the output drivers thereof.

In many cases, the calibration circuit of an integrated circuit is continually running and updating at a given frequency in the background not specified by the user. Ideally, the calibration circuit of the integrated circuit would only determine if the impedance of the output driver is correct when the power supplies are quiet. But, given that the output drivers are on a chip that executes other commands that can create noise on the power supplies, it is difficult to time exactly the best time to calibrate. It is possible the user might have asked the part to execute a command that creates noise, yet the calibration circuit has been internally requested to execute. So, there is conflict. Does the part calibrate, or execute the user's requested command, or both?

Therefore, instead of continually running the calibration circuit in the background, it is desirable to leave it up to the user to indicate when to calibrate. As such, this creates a unique environment for the calibration circuit; there is now a need for quick calibration so as to not impede other operations of the chip the output drivers are involved in. Furthermore, because of this need for a quick calibration and because with speed typically comes undesirable noise causing calibration error, sometimes noted as Ldi/dt noise, a system that is also noise tolerant is desirable.

In a typical application of a calibration circuit, the user supplies a known resistance to a pad which interfaces the outside world to the internals of the chip—specifically interfacing a calibration circuit to output drivers used for reading data in a normal operation of a chip. A typical calibration circuit 102 is shown in FIG. 1 and described in further detail below. When connecting to the outside world, there are some unknowns; specifically, how much interconnect and parasitic capacitance is added to the pad. And because the circuit interfaces to the outside world, will there be Electrostatic Discharge (ESD) into the pad that could harm some of the internal circuits?

Since capacitance will undoubtedly be added with the addition of the user's resistor and interconnect, it is desirable to have a calibration system that can tolerate a relatively large capacitance yet still calibrate quickly. The prior art calibration circuit shown in FIG. 2 lacks this quality. Since it first calibrates the P-channel transistors by turning on and off gates PON-<N:0> until the voltage at node ZQ is ½ VCC, and then calibrates the N-channel transistors to a replicated copy of the P channel drivers by turning on and off gates NON<N:0> until the voltage at node DQOUT is ½ VCCE, there is time lost by calibrating the P-channel driver transistors first, then the N-channel driver transistors. Furthermore, because there is potentially a relatively large amount of capacitance on ZQ, Czq 223, the calibrator circuit 200 will have to wait an amount of time for VZQ to settle each time PON-<N:0> changes proportional to Czq. This is because there is a fixed amount of current available to charge the ZQ node. Therefore circuit 200 does not provide a fast method of calibration. Due to the parasitic capacitance on node ZQ, each calibration step must be followed by a pre-determined delay time to allow node ZQ to reach its near steady state value before the next calibration step can be initiated, as is shown in waveform 232.

Although the prior art circuit 200 in FIG. 2 cannot achieve a high speed of calibration, a past design, such as U.S. Pat. No. 6,919,738 B2 entitled "System and Method for Controlling the Drive Strength of Output Drivers in Integrated Circuit Devices", has the strength of placing emphasis on making the nodes internal that need to toggle quickly. This makes the capacitance during switching of strengths a known and manageable entity. Specifically, since the switching nodes are internal, a low internal node capacitance can be designed. Thus, the overall speed of calibration can be increased. The '738B2 circuit also helps speed calibration, and appears to calibrate both N- & P-channel drivers simultaneously. This however does lead to more noise due to both devices being switched in and out simultaneously. Since minimizing power during non-operational times is also critical, it is desirable to be able to enable/disenable the calibration. Because of this need for enabling/disabling, the '738B2 appears to be lacking a quick method for initialization if there was a large amount of parasitic capacitance on the ZQ node (shown in FIG. 3).

Integrated circuit 100 according to the prior art includes a calibrator circuit 102 coupled to "N" number of pullup drivers 112 and "N" number of pulldown drivers 114. These drivers can be calibrated for internal chip purposes as well as offchip drivers. Calibrator 102 includes a calibrate state generator block 104, a sample and hold circuit 106, pullup driver 108, and pulldown driver 110. Bondpad 120 associated with the calibrator circuit 102 is coupled to output impedance ZQ 122. Bondpad(s) 124 are coupled to the output of drivers contained in 112 and 114. The input of pullup driver 108 receives the PON-<N:0> input signal, and the input of pulldown driver 110 receives the NON<N:0> input signal. The input of pullup drivers 112 receives the PONL-<N:0> input signals, and the input of pulldown drivers 114 receives the NONL<N:0> input signals. These signals are latched versions of the corresponding signals from sample and hold 106.

Referring now to FIG. 3, a basic calibration circuit 300 includes a first driver circuit 302 including P-channel transistors M14, and M15 through M16. The gates of the transistors 328 in FIG. 3 are controlled by a pullup counter 356. Similarly, the gates of transistors 333 are controlled by a pulldown counter 354. Driver circuit 300 also includes resistors R1, R2, and R3, also designated 303, 304, and 322, respectively. Resistor 322 is coupled to the ZQ bondpad, which in turn is coupled to operational amplifier OP1. A pullup driver circuit 328 includes a plurality of P-channel transistors M6 through M7. A pulldown driver circuit 333 includes a plurality of N-channel transistors M17 through M19. Operational amplifier OP2 is coupled between the voltage divider R1/R2, the drain of transistor M15 and the current mirror 350/352. Operational amplifier OP3 is coupled between the drain of transistor M15, the drain of transistor M7, and the pullup counter 356. Operational amplifier OP4 is coupled between VZQ, the drain of transistor M16, and the pulldown counter 354.

Calibration circuit 300 adjusts the gate voltage of transistor M14 until VZQ is equal to VCCE/2. Then, the gates of the transistors in driver circuits 328 and 333 are switched on and off until the voltages VP and VN equal VCCE/2. The method of calibration used by circuit 300 calibrates both the P-channel transistors in driver 328 and the N-channel transistors in driver 333 simultaneously since the same clock goes into both drivers. This leads to an undesirable noise effect generated by turning on and off the strongest drivers at the same time.

In both cases of the prior art shown in FIGS. 2 and 3, if the calibration circuit must interface with the outside world, ESD has been neglected. Certainly it is possible that the resistor to be calibrated to is internal to the chip, and therefore the ESD protection for the calibration circuit is not needed. However, within the scope of this invention, it is assumed it must be able to but is not required to interface with the outside world. Neither calibration circuit shown in FIG. 1 or FIG. 3 is able to quickly calibrate with noise tolerance the output driver section when there is a great deal of parasitic capacitance on the external bondpad node associated with the external reference impedance.

What is desired, therefore, is a calibration circuit for calibrating the output driver section of an integrated circuit that is able to operate quickly with noise tolerance and accurately, even if there is a large capacitance associated with the bondpad coupled to the external reference impedance.

SUMMARY OF THE INVENTION

According to the present invention, a calibration circuit for an output driver section of an integrated circuit is able to effectively tolerate a relatively large parasitic capacitance on the bondpad coupled to an external reference impedance (the "ZQ" pad). To accommodate this, the circuit and method of the present invention incorporates the prior art approach of making the nodes internal that need to charge or discharge during calibration. However, the circuit and method of the present invention further improves this basic technique. For speed, the circuit and method of the present invention includes transistor devices to bring the voltage on the ZQ bondpad to its final steady-state value very quickly. The calibration circuit of the present invention also shares parts of the P-channel and N-channel calibration. In order to alleviate noise generated on the supplies and hence to a more accurate calibration, the circuit and method of the present invention time shifts the calibration of the strongest P-channel and N-channel drivers. In other words, the circuit and method of the present invention calibrates the strongest N-channel driver transistor, waits for a predetermined delay time, then calibrates the strongest P-channel driver transistor, waits, then calibrates the remaining P-channel and N-channel drivers simultaneously. This approach maximizes performance for both speed and noise. According to the present invention, it is certainly possible to time shift the other tunable legs in the output driver as well. Also, in order to fully make the calibration circuit interface with the outside world, the present invention includes several key ESD protection devices.

The foregoing and other objects, features and advantages of the invention will become more readily apparent from the following detailed description of a preferred embodiment of the invention, which proceeds with reference to the accompanying drawings.

DETAILED DESCRIPTION

Figure 1:
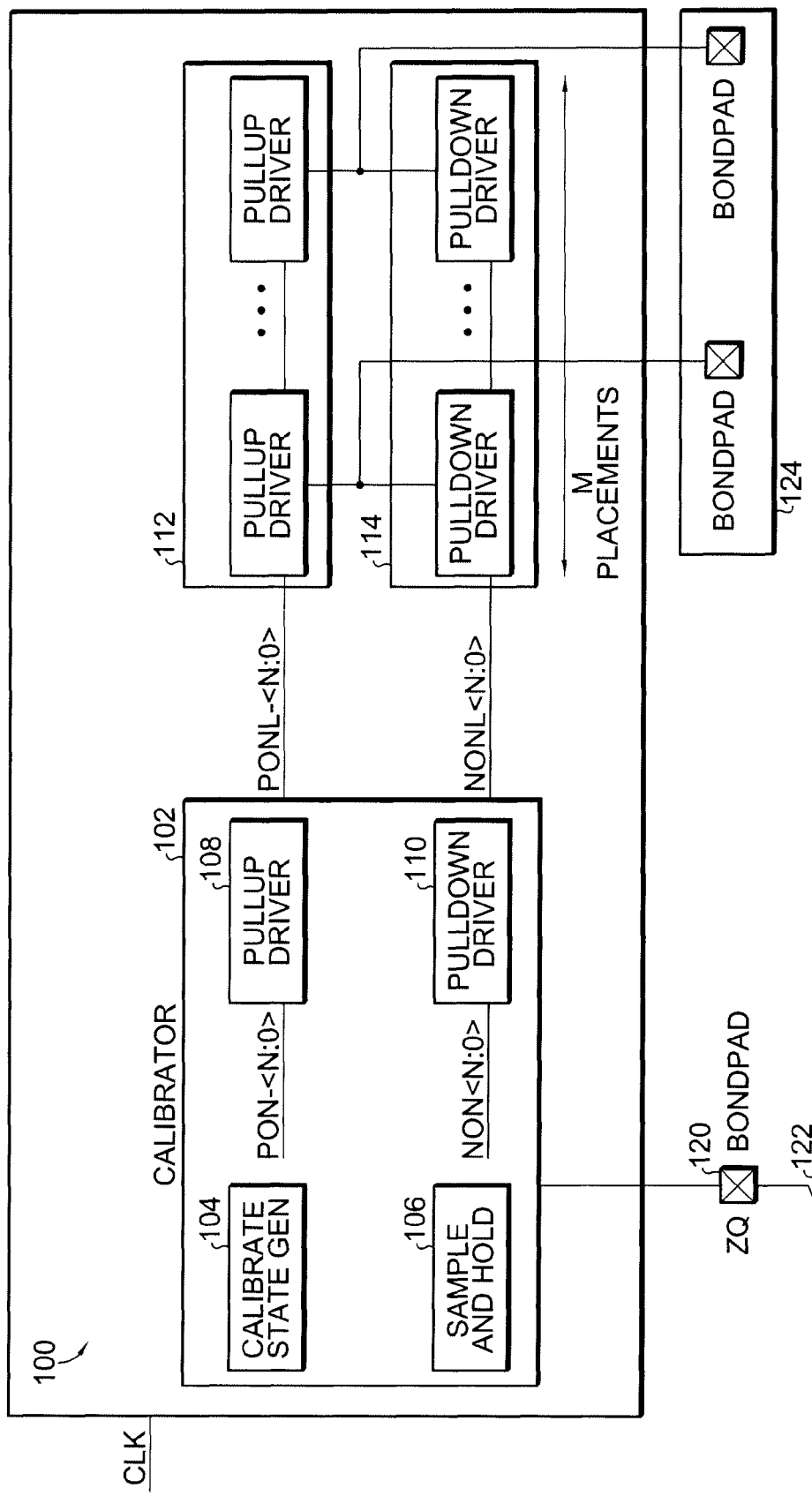
FIG. 1 is a block diagram of an integrated circuit including an output driver block and a calibration circuit having P-channel and N-channel transistors calibrated in parallel and an external resistor coupled to ground according to the prior art.
Figure 2:
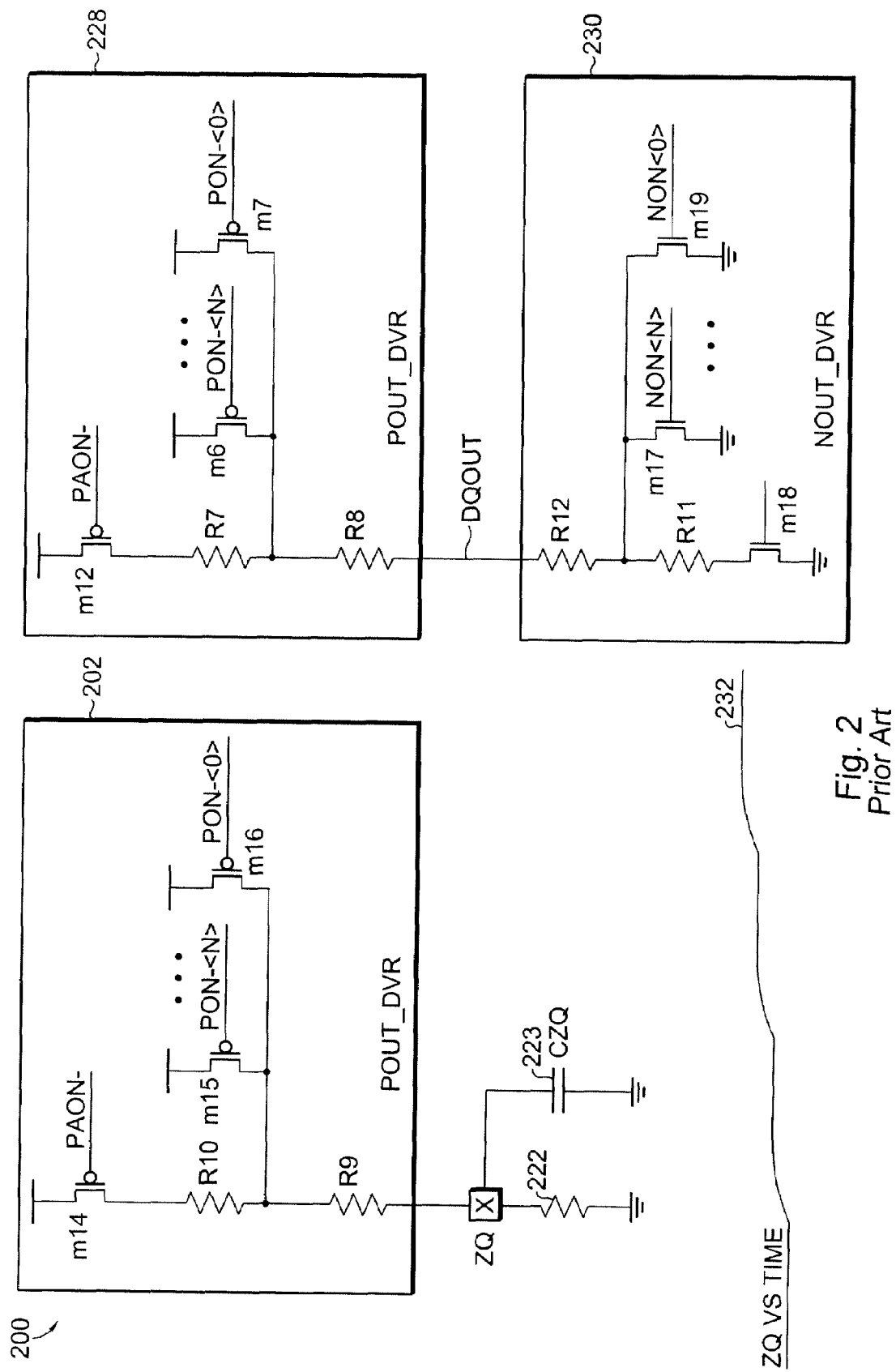
FIG. 2 is a circuit schematic of a calibration circuit that first calibrates P channels and then calibrates N channels to P channels according to the prior art.
Figures 3, 3A:
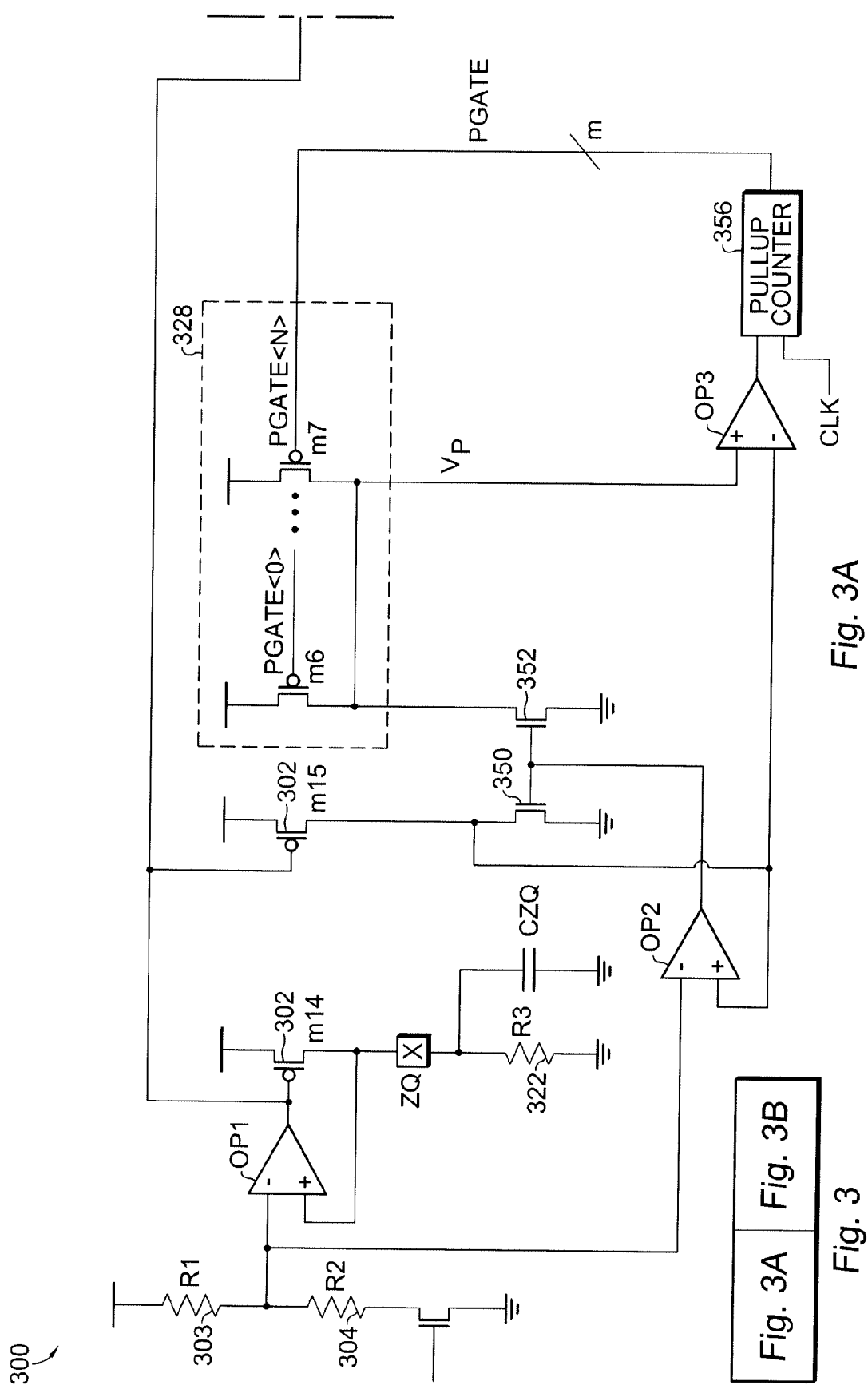
FIG. 3 is a circuit schematic of an embodiment of a calibration circuit shown in FIG. 1 according to the prior art.
Figure 3B:
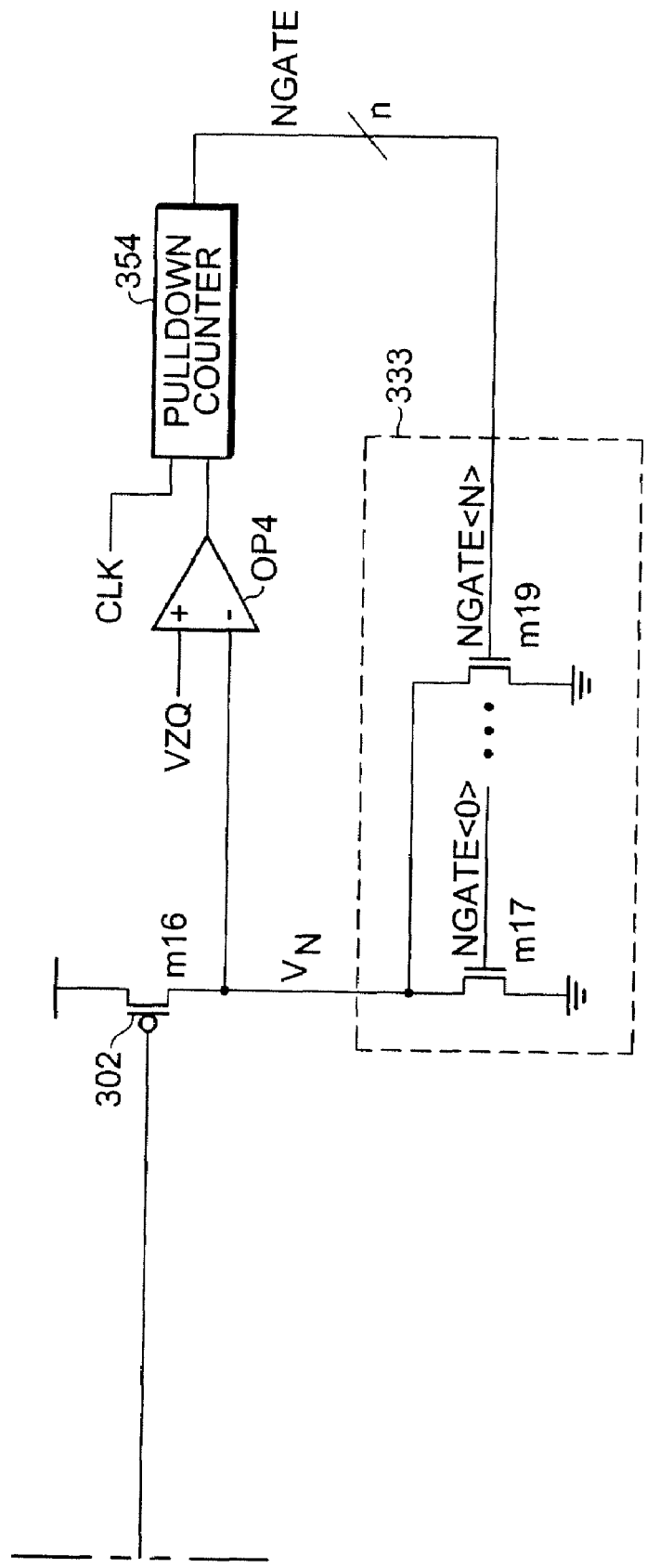
Figure 4:
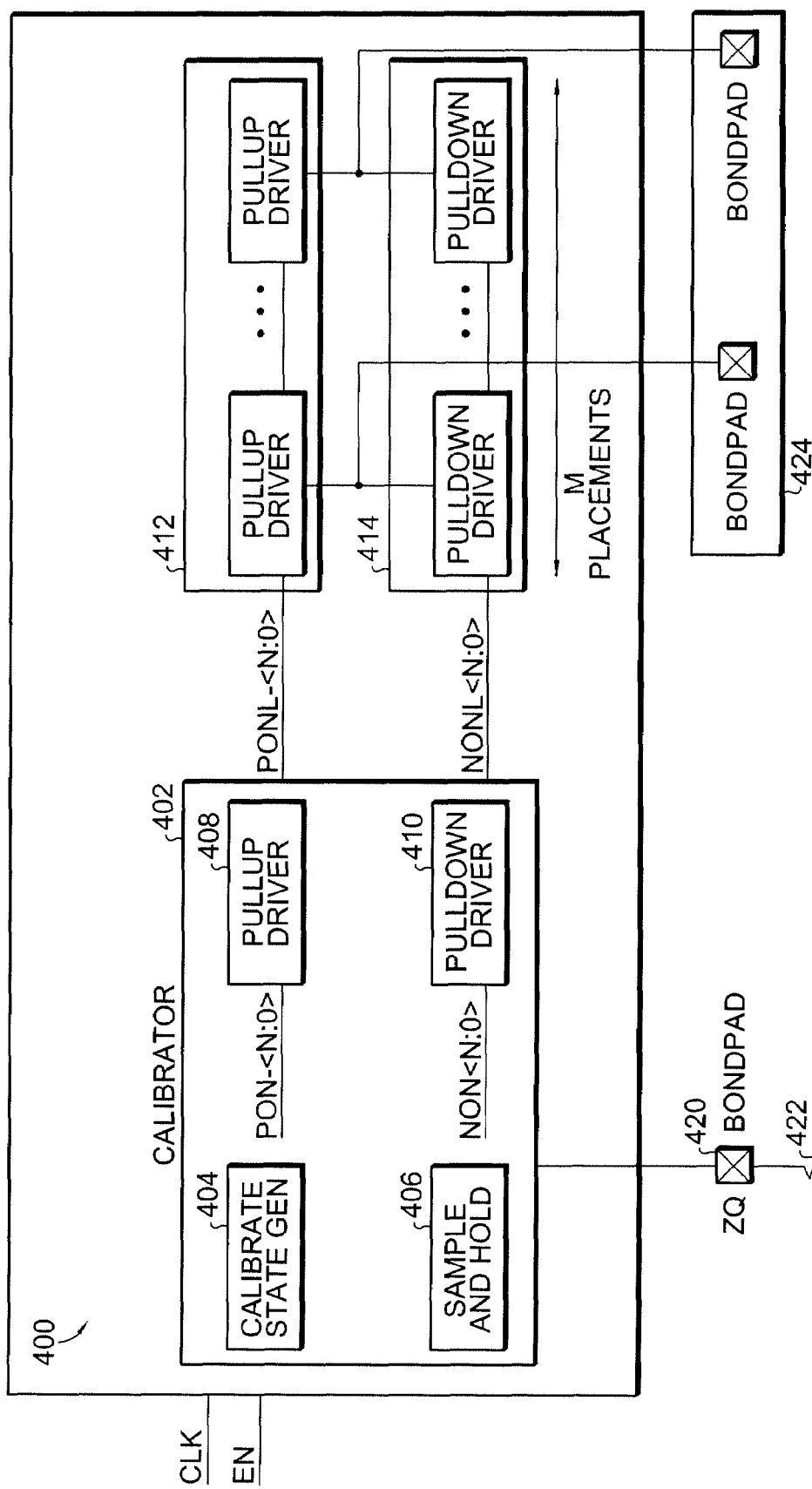
FIG. 4 is a block diagram of a calibration circuit according to a first embodiment of the present invention.

Referring now to FIG. 4, a block diagram of a calibration circuit 400 according to a first embodiment of the present invention is shown. At the block diagram level, FIGS. 1 and 4 are very similar, except for the EN enable signal shown in FIG. 4. All of the other blocks correspond to blocks shown in FIG. 1. For example blocks 102, 104, 106, 108, 110, 112, and 114 shown in FIG. 1 correspond to blocks 402, 404, 406, 408, 410, 412, and 414 shown in FIG. 4. Bondpads 120 and 124 correspond to bondpads 420 and 424 shown in FIG. 4. Resistor 122 shown in FIG. 1 corresponds to resistor 422 shown in FIG. 4. While at the block diagram level, FIGS. 1 and 4 are similar, there are numerous differences at the transistor level and in the method of operation, as is explained below with respect to FIG. 5.

Figures 5, 5A:
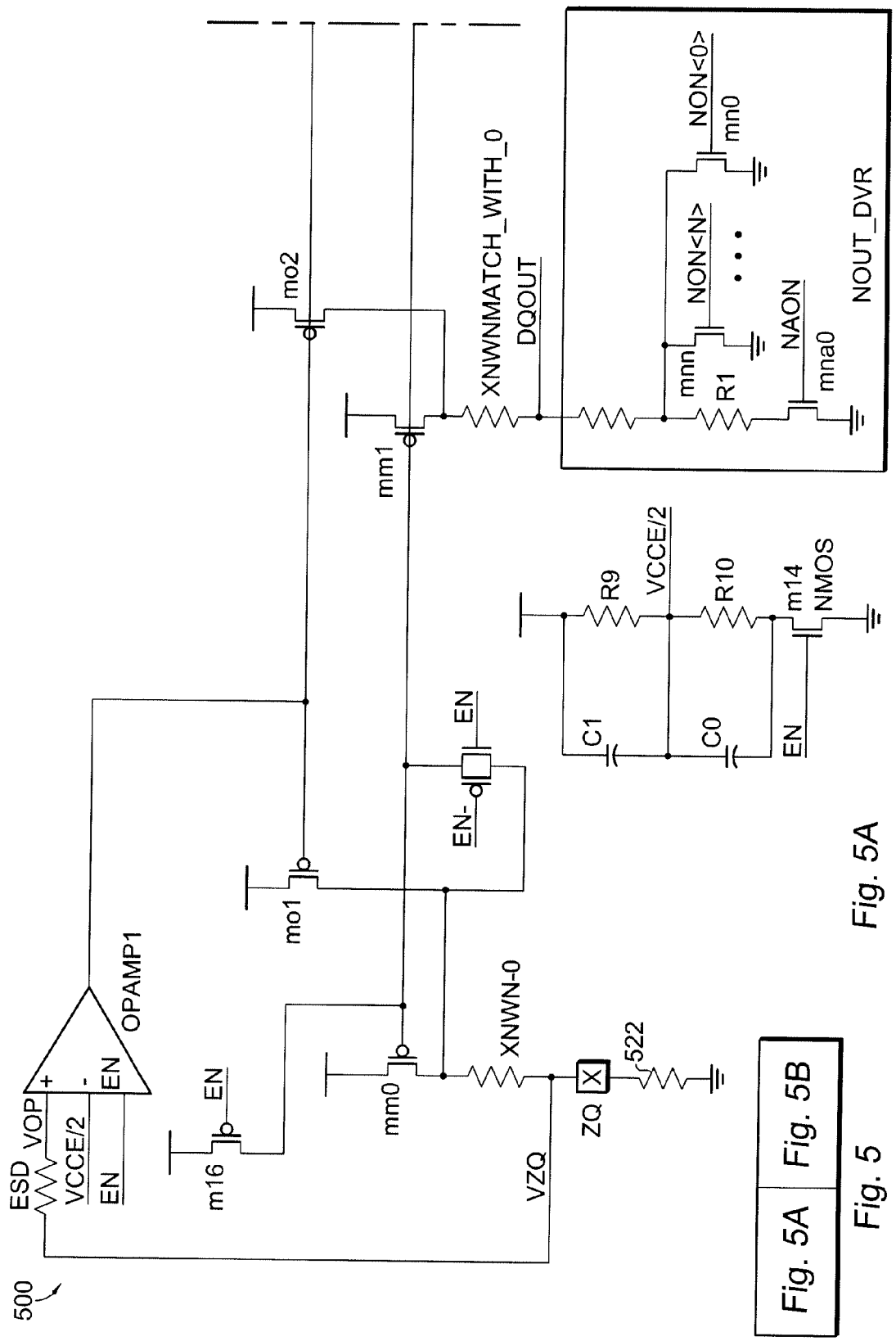
FIG. 5 is a circuit schematic of a calibration circuit according to a first embodiment of the present invention.
Figure 5B:
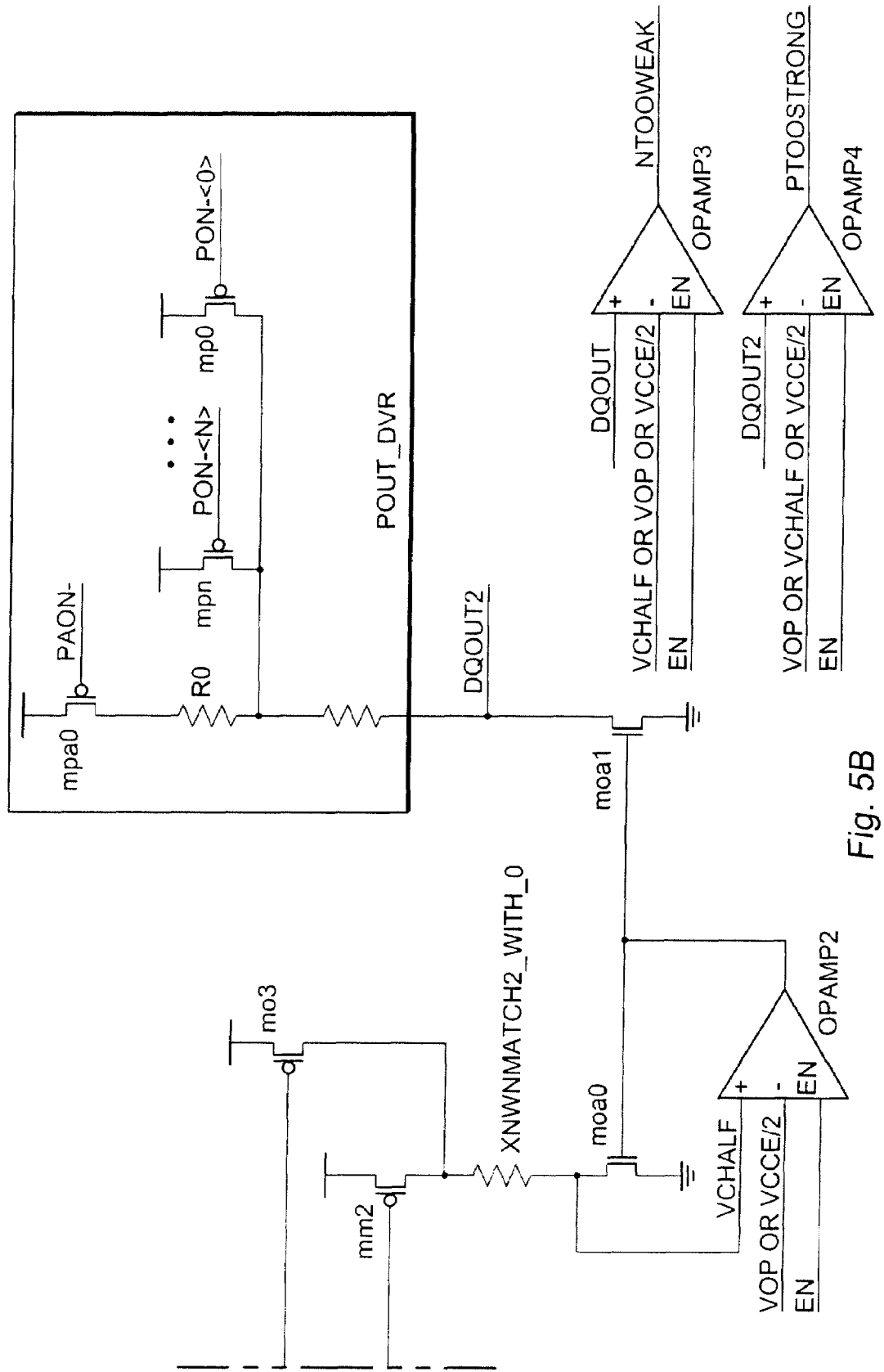

Referring now to FIG. 5, a schematic diagram of a first embodiment 500 of a calibration circuit is shown according to the present invention. The user will attach a known resistance 522 to the ZQ pad. Upon initial powerup of the chip, the user will issue a calibrate command. However, this command may not be necessary since the calibration could respond to either a) a power-on detect circuit, or b) an external reset signal, or c) internal calibrate command.

After the chip has received a calibrate command either by the user, a power-on detect, reset signal, or some other internally generated calibrate command, for speed considerations, VZQ (the voltage on the ZQ pad) is brought up initially via P-channel transistor mm0 to a voltage higher than ground (VSS). Also, VCCE/2 is starting to develop via capacitor divider C1/C0 and resistor divider R9/R10. It is of notable mention, that U.S. Pat. No. 6,919,738 does not take into account, at least for speed in calibration, that Opamp1 takes time to settle, charge its internal nodes, and react to its inputs. Therefore, it cannot reliably pullup node VZQ to VCCQ/2 until its internal nodes have settled. Here, P-channel transistor mm0 is available quicker than the operational amplifier controlled P-channel transistor mo1 to provide pullup current. As shown in timing diagram of FIG. 8, also, upon receiving the calibrate command, signals NAON as well as NON<N:0> are forced high and PAON- and PON-<N:0> are forced low. This is done early before actually toggling the digital switches of the drivers so as to minimize noise on the power supplies during the actual calibration comparison of each driver to the reference resistor 522. (Any time there is a change in current versus time, and there is inductance present whether intentional or parasitic, a voltage of LdI/dT is generated, and introduces noise in the system; therefore, it is desirable to minimize dI/dT during the actual calibration of the output driver with the reference.)

Some time after receiving the calibrate command, Opamp1 is ready and starts controlling the gate of P-channel transistor mo1 to force the condition VZQ=VCCE/2. In order to protect the gate of the positive input to Opamp1, an ESD resistor is placed in series with VZQ. It is crucial that VZQ, the external pad not go directly to a gate in any of the operational amplifiers. Instead voltage VOP is used. Otherwise, excessive voltage on the pad can couple and destroy the internal operational amplifier devices.

At the same time of VZQ development, the current of P-channel transistors mm0 and mo1 is mirrored respectively to P-channel transistors mm2 and mo3, as well as mm1 and mo2. Initially, the current may not be the same due to a difference in VDS of transistors mm0 and mm2, and transistors mo1 and mo3. Due to a non-perfect Rout as a result of drain-induced barrier lowering (DIBL), channel length modulation, and other parasitic effects, defined as Rout=dVds/dIds, Rout is not infinite in saturation. In other words, even if two devices are perfectly matched (same IV curves), if there is a change in VDS of two devices that have the same gate and source voltage, the current is not the same. Because of this non-ideal Rout, it is preferable to guarantee devices that are to have the same current to have not only the same VGS, but also the same VDS. As such, Opamp2 has been added to create a nearly ideal current mirror of N-channel transistors moa0 and moa1. Gate currents are assumed to be nearly zero.

Since Opamp2 forces the condition Vchalf=VCCE/2 and Opamp1 forces the condition VZQ=VCCE/2, then assuming the devices mm0, mo1 are matched to devices mm2, mo3 respectively and resistor XNWN_0 is matched to resistor XNWNmatch2_with_0, then the same VDS will be generated across transistors mm0, mo1, mm2 and mo3. Here it is of mention that resistor XNWN_0 is placed in series with VZQ to the drain of transistor mm0 in order to protect the drain junction of transistor mm0 from ESD. And in order to create the aforementioned condition, VDS of transistors mm0, mm2, mo1, and mo3 is to be the same. Resistor XNWNmatch2_with_0 is placed in series with Vchalf, and the drain of transistor mm2 and resistor XNWNmatch_with_0 is placed in series with the drain of transistor mm1 and DQOUT.

Depending on process requirements, this device, XNWN_0, XNWNmatch_with_0, and XNWNmatch2_with_0 may not be necessary if the drain of a P-channel transistor, particularly the junction of transistor mm0 is strong enough to sustain a suitable level of ESD protection. Also, it is possible the resistance, XNWN_0, is intentionally combined, not a separate entity, with the drain of transistor mm0 by increasing drain length (resistance) and therefore increasing the source-to-drain resistance of transistor mm0. It is of mention that XNWN_0 and XNWNmatch_with_0, XNWNmatch2_with_0 are not only resistors but also diodes. The device is comprised of including but not limited to N-type over P-type doped silicon. Effectively, XNWN_0 can be included in transistor mm0, or can be a separate device. Or, if using minimum design rules, if the drain junction of transistor mm0 can sustain enough ESD, XNWN_0 and hence XNWNmatch_with_0 and XNWNmatch2_with_0 need not be added. However, if XNWN_0 is added, XNWNmatch_with_0 AND XNWNmatch2_with_0 must be added, or else the VDS of transistors mm0, mm1, mm2, mo1, mo2 and mo3 will not be the same and hence the devices will not work as well as a current mirror.

Figure 8:
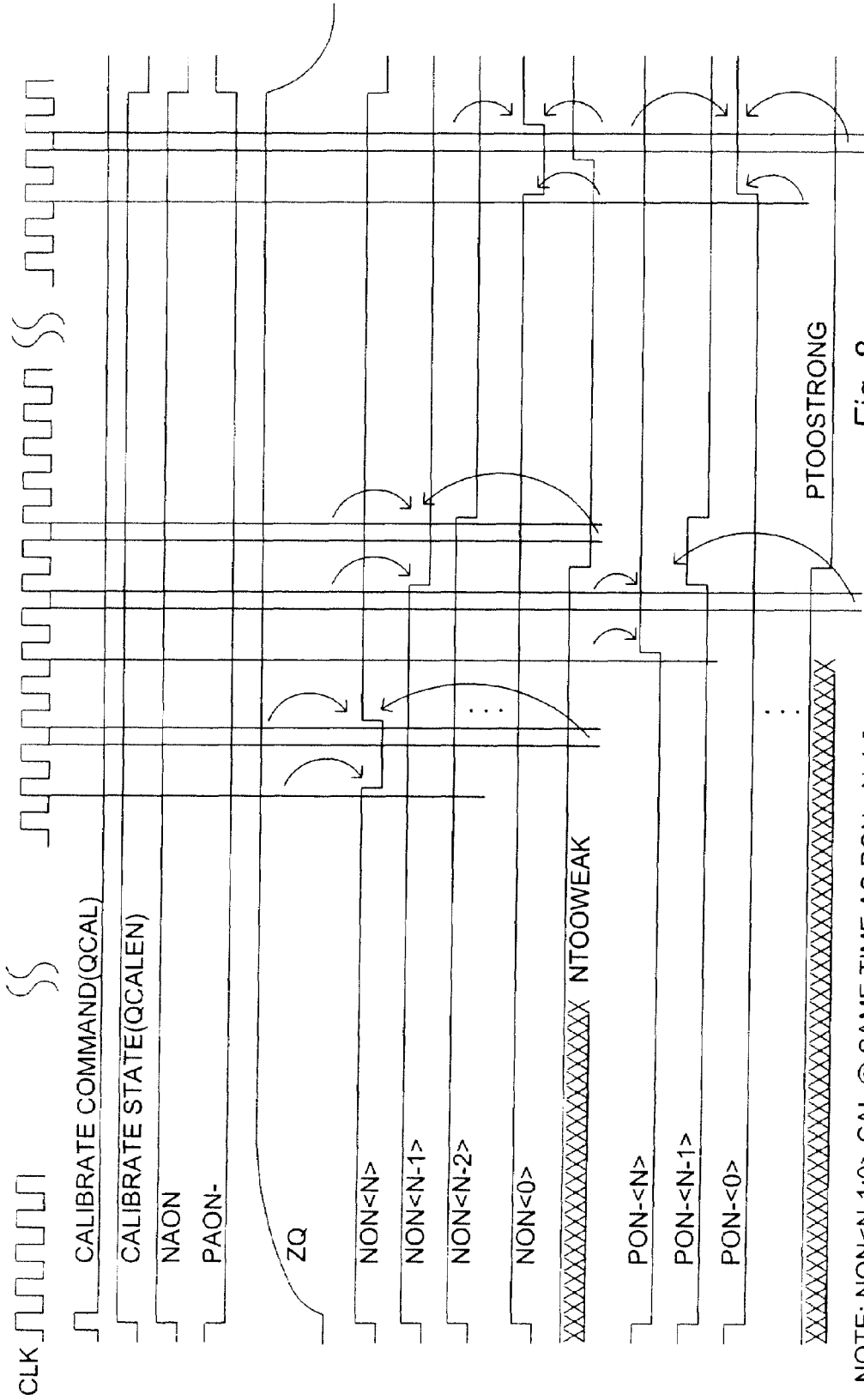
FIG. 8. is a timing diagram associated with the calibration circuit of the present invention shown in FIGS. 4 and 5.

After VZQ has been brought to VCCE/2, or close to VCCE/2, NON<N> goes low (turns off transistor mnn), and then V(DQOUT) is compared via Opamp3. The corresponding timing sequence is shown in FIG. 8. One and a half clock cycles (1.5 clks) later Opamp3 provides a signal as to whether V(DQOUT) is higher or lower than a voltage VCCE/2 (this time can be <1.5 clks assuming Opamp3 is fast enough, or >1.5 clks, but 1.5 clks was chosen for ease in design). If V(DQOUT) is lower, NON<N> is kept off, or else it turns back on (goes high). It is of notable mention that the control signals, NON <N:0> and PON-<N:0> and NAON, PAON— should be of equal voltage level to that of the real output buffers contained on the chip. Also, VCCE/2 is a theoretical voltage assuming perfect operational amplifiers and components. Operational amplifiers 3 and 4 can use a node different than VCCE/2 as noted in FIG. 5.

Then, four clocks after the start of NON<n> falling PON-<N> goes high (turns off transistor mpn), and V(DQOUT2) is compared via Opamp4 as to whether V(DQOUT2) is higher or lower than a voltage VCCE/2. If 1.5 clock cycles later, V(DQOUT2) is higher than VCCE/2, then transistor mpn stays off (PON-<N> stays high). Otherwise, if V(DQOUT2) is lower than VCCE/2, then transistor mpn turns back on.

Then, two clock cycles after the start of PON-<N> going high, NON<n−1> goes low and PON-<n−1> goes high. And 1.5 clks later V(DQOUT) and V(DQOUT2) are sampled by Operational amplifiers 3 and 4 respectively. If V(DQOUT) is >VCCE/2, then NON<n−1> goes back high, otherwise it stays low. Similarly, if V(DQOUT2) is >VCCE/2 then PON-<N−1> stays high, otherwise it goes back low. This sequence repeats until the last driver transistors mp0 and mn0 are turned off and the results compared via Operational amplifiers 3 and 4. At the end, a code of PON-<N:0> and NON<n:0> has developed and represents the required devices to be turned on and off to achieve a match within a certain tolerance of the output driver impedance to the user's applied resistance.

These codes are latched and so named PONL-<N:0>, NONL<N:0> during the calibration process and sent off to a copy of the buffers that were used in calibration, namely POUT_DVR and NOUT_DVR. It is of note that the driver transistor mnn is intended to be $2^n$ times as strong as transistor mn0 but could be slightly off due to process variation. Also, transistor mpn is $2^n$ times as strong as transistor mp0, and it too can be slightly off due to processing errors.

It should be noted that P-channel and N-channel calibration can be performed simultaneously, or can be time-shifted for optimizing noise and speed. In FIG. 5, the ESD resistor is placed near the gate of the positive terminal of Opamp1. Due to channel length modulation, DIBL, and other parasitic effects, for good current matching, the VDS of transistors mo1, mo2, mo3, mo0, moa1 are set to be equal via Operational amplifiers 1 and 2. The output of Opamp1 switches to VCCE when disabling transistors m01, mo2, and mo3. The AC compensation circuits for the operational amplifiers in FIG. 5 are left out for simplicity, but can be used in an actual design. AC compensation circuits are well known to those skilled in the art and vary with according to the actual operational amplifiers used, component selection, and component values in the design of the calibration circuit 500 of FIG. 5. The PASSGATE used in FIG. 5 is to limit the capacitance on bondpad ZQ when the calibration circuit is turned off. It is of note, multiple calibrators could share the same ZQ resistor, and therefore it is desirable to limit the capacitance by including the PASSGATE. The pullup and pulldown circuits can include binary-weighted transistors if desired, although this is difficult to achieve in an actual implementation. The pullup and pulldown circuits NOUT_DVR and POUT_DVR each have N control signals (six control signals are used in an embodiment of the present invention) for a total of thirty-two ZOUT steps per P-driver/N-driver (one control signal of the six, not changed by the calibrator, but could be controller by the calibrator as well, if desired). The VOP voltage shown in FIG. 5 is associated with Opamp1. Preferably, VOP is not used with respects to Operational amplifiers 2, 3, and 4 so as to not unnecessarily slow the settling of VZQ on the ZQ bond pad by adding extra capacitance to the VOP node.

Successive approximation is used in capturing the NTOOWEAK and PTOOSTRONG signals. This allows for five unique clock cycles need for P-calibration and five unique cycles for N-calibration. The P-calibration and N-calibration can be done at the same time, but for noise alleviation, they can be time shifted. For example, the strongest N device (NON<N>) can be calibrated first then the strongest P device (PON-<N>) then the second strongest P(PON-<N−1>) and N(NON<N−1>) can be done simultaneously.

The successive approximation algorithm according to the present invention starts with all devices on (either P-channel or N-channel). Every two clock cycles, turn off the highest order devices. For example, for five devices, mp5 is turned off first, then sample PTOOSTRONG. If PTOOSTRONG is asserted (equal to a logic one), keep device mp5 off. Otherwise turn device mp5 back on, then turn off device mp4, then sample PTOOSTRONG. If PTOOSTRONG is equal to one, keep mp4 off. Otherwise turn device mp4 back on, until mp0 is turned off and sampled. At the end a code of PON-<4:0> will have developed. That code will be the calibration code for P-channel devices. The same sequence occurs for N-channel transistors and can occur at the same time as P-calibration, or shifted in time for noise purposes.

Capacitor divider C0/C1 is used for quick, low power VCCE/2 generation. Transistor mm0 is used for quick ZQ initialization, since operational amplifiers are slower to respond than current mirrors. Transistors mm1 and mm2 are used for mirroring the current of transistor mm0.

Figure 6:
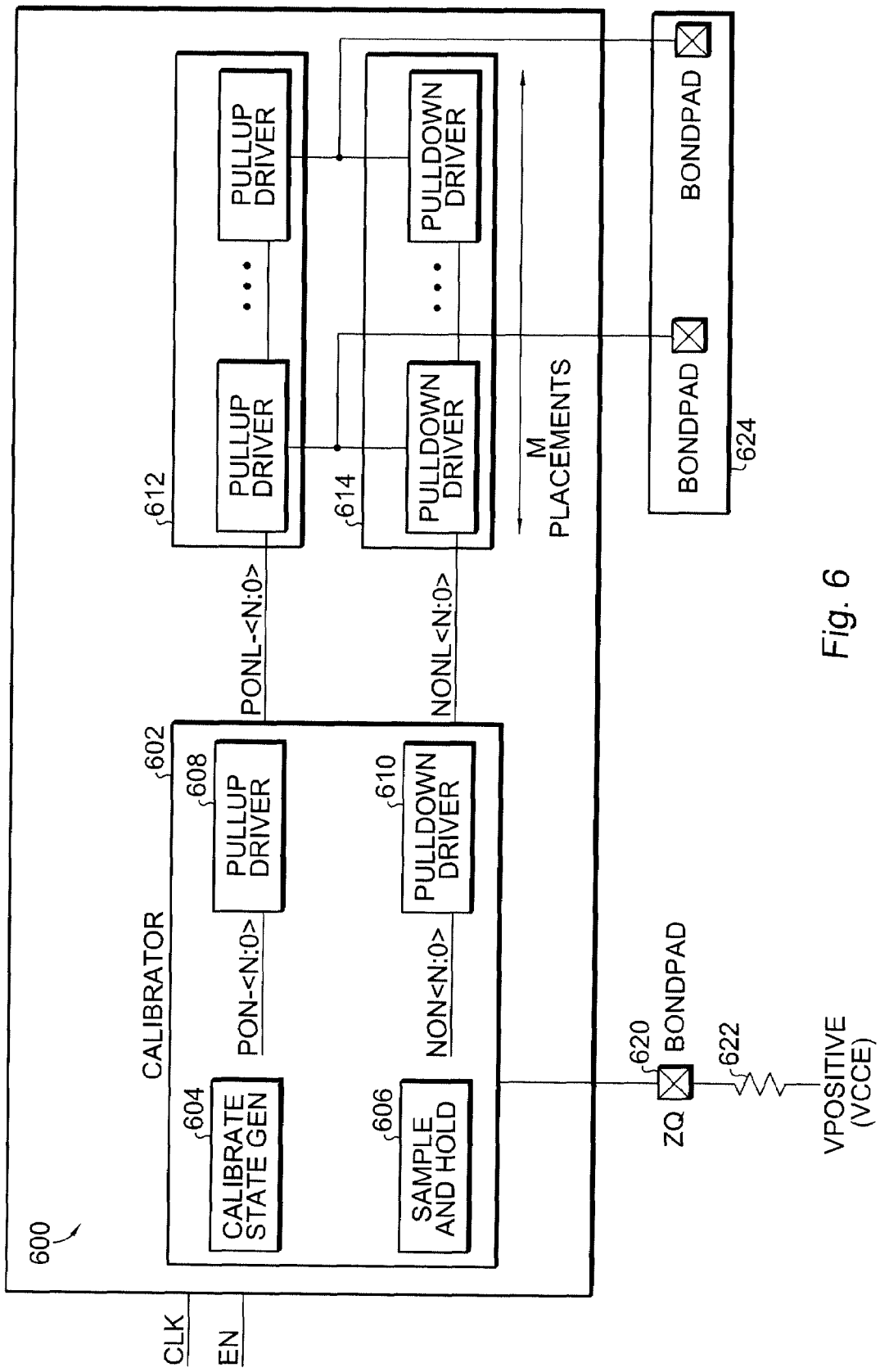
FIG. 6 is a block diagram of a calibration circuit according to a second embodiment of the present invention.

Referring now to FIG. 6, a block diagram of a calibration circuit 600 according to a second embodiment of the present invention is shown. At the block diagram level, FIGS. 4 and 6 are very similar, except that resistor 622 in FIG. 6 is coupled to VCCE and not to ground as is shown for resistor 422 in FIG. 4. All of the other blocks correspond to blocks shown in FIG. 4. For example blocks 402, 404, 406, 408, 410, 412, and 414 shown in FIG. 4 correspond to blocks 602, 604, 606, 608, 610, 612, and 614 shown in FIG. 6. Bondpads 420 and 424 correspond to bondpads 620 and 624 shown in FIG. 6. Resistor 422 shown in FIG. 4 corresponds to resistor 622 shown in FIG. 6.

Figure 7B:
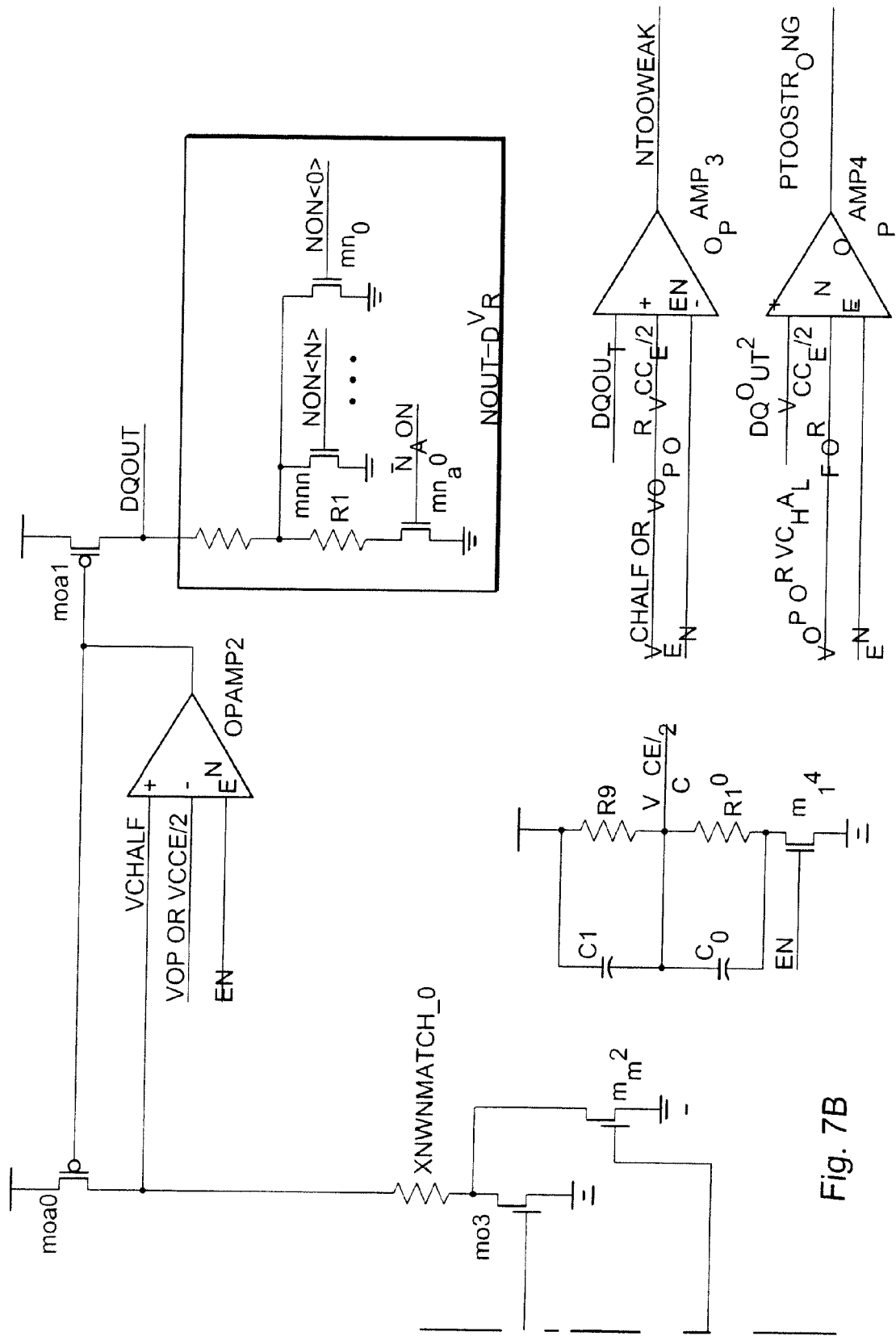
FIG. 7. is a circuit schematic of a calibration circuit according to a second embodiment of the present invention.

FIG. 7 is a circuit schematic of a calibration circuit according to the second embodiment of the present invention. While circuit 700 is substantially the same as described in FIG. 5, the external resistor 722 is coupled to VCCE, and not to ground as is shown in circuit 500 of FIG. 5.

Figure 9:
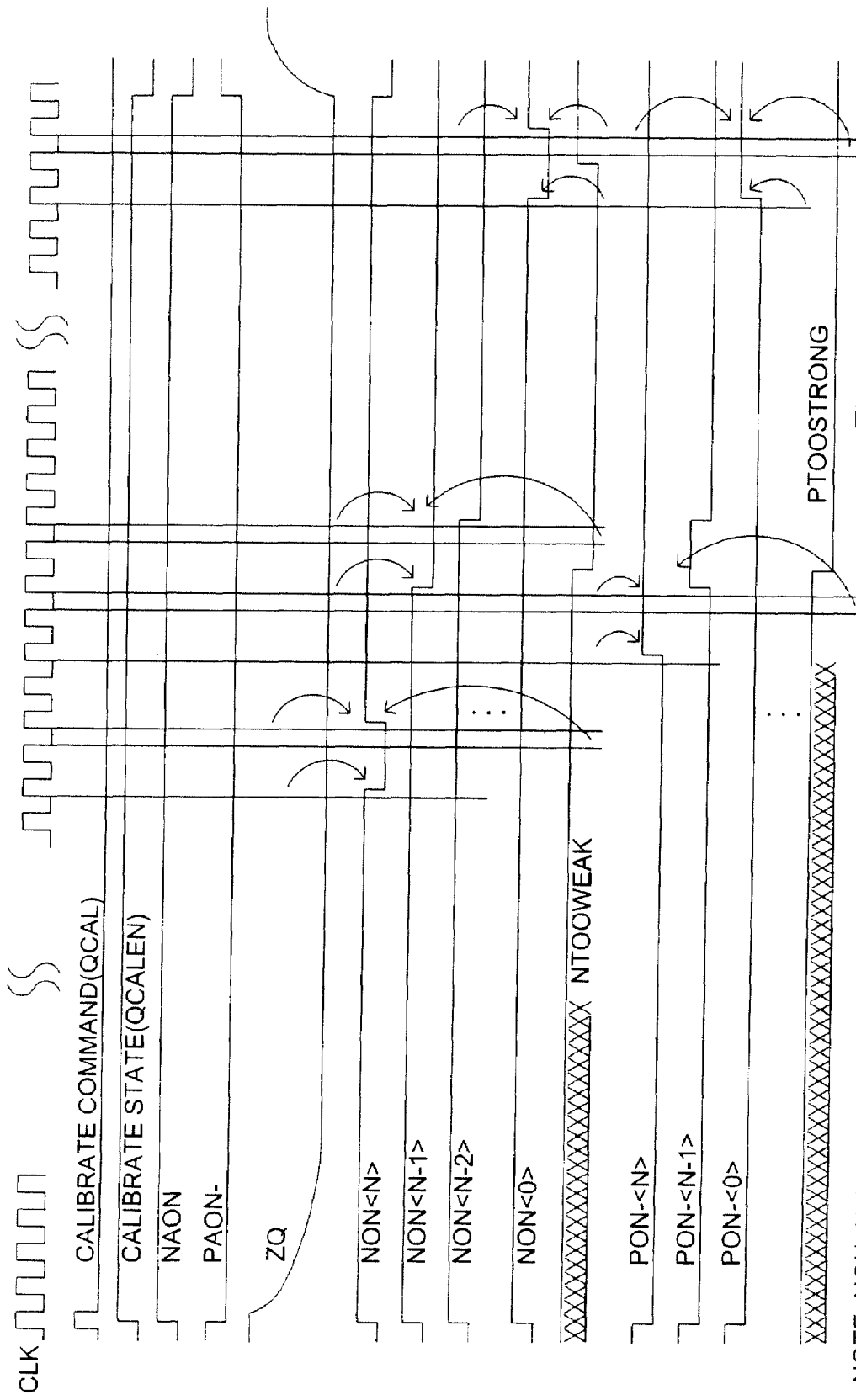
FIG. 9 is a timing diagram associated with the calibration circuit of the present invention shown in FIGS. 6 and 7.

The timing diagram of FIG. 9 is substantially the same as the timing diagram of FIG. 8. However, note that the ZQ voltage waveform is different since external resistor 722 is coupled between the ZQ bonding pad and VCCE, and not ground as is the case with the timing diagram of FIG. 8.

Having described and illustrated the principle of the invention in a preferred embodiment thereof, it is appreciated by those having skill in the art that the invention can be modified in arrangement and detail without departing from such principles. Although a preferred method and circuit has been shown, the exact details of the preferred method and circuit can be changed as desired as required for a particular application. For example, removing XNWN resistors/diodes, having more tuning devices for finer resolution in the driver circuits, using an internal resistor instead of an external calibration resistor, removing operational amplifiers and just using traditional current mirrors whereby the VDS is not necessarily guaranteed to be the same for all devices, and using control signals that are generated simultaneously for at least one set of drivers but not for all drivers can all be used individually or in combination if acceptable in a particular application. We therefore claim all modifications and variations coming within the spirit and scope of the following claims.

I claim:

1. An output driver calibration circuit comprising:
   a programmable drive strength output pullup driver comprising a strongest transistor and a plurality of other transistors;
   a programmable drive strength output pulldown driver comprising a strongest transistor and a plurality of other transistors;
   a calibration circuit for generating, a plurality of control signals for controlling the transistors in the output pullup driver and the transistors in the output pulldown driver;
   a first current mirror coupled to an output impedance node; and
   a second, parallel, current mirror coupled to the output impedance node,
   wherein the control signals are generated simultaneously, except for the strongest driver transistors.

2. The output driver calibration circuit of claim 1 wherein the strongest transistor in the pullup driver receives a first control signal.

3. The output driver calibration circuit of claim 1 wherein the strongest transistor in the pulldown driver receives a first control signal.

4. The output driver calibration circuit of claim 1 wherein the pullup driver comprises a plurality of substantially binarily weighted P-channel transistors.

5. The output driver calibration circuit of claim 1 wherein the pulldown driver comprises a plurality of substantially binarily weighted N-channel transistors.

6. The output driver calibration circuit of claim 1 further comprising a load resistor coupled between the output impedance node and ground.

7. The output driver calibration circuit of claim 1 further comprising a load resistor coupled between the output impedance node and a positive supply voltage.

8. The output driver calibration circuit of claim 1 wherein the second current mirror comprises an operational amplifier.

9. The output driver calibration circuit of claim 1 further comprising an ESD protection circuit coupled to the output impedance node.

10. The output driver calibration circuit of claim 9 wherein the ESD protection circuit comprises a resistor, a diode, or the parallel combination of a resistor and a diode.

11. An output driver calibration circuit comprising:
    an output impedance node;
    an N-channel block of transistors;
    a P-channel block of transistors;
    a first current mirror having a first input coupled to the output impedance node, a first output coupled to the N-channel block of transistors, and a second output;
    a second, parallel, current mirror having a first input coupled to the output impedance node, a first output coupled to the N-channel block of transistors, and a second output; and
    a third current mirror having an input coupled to the second outputs of the first and second current mirrors, and an output coupled to the P-channel block of transistors.

12. The output driver calibration circuit of claim 11 wherein the second current mirror further comprises an operational amplifier.

13. The output driver calibration circuit of claim 11 wherein the third current mirror further comprises an operational amplifier.

14. The output driver calibration circuit of claim 11 further comprising a load resistor coupled between the output impedance node and ground.

15. An output driver calibration circuit comprising:
   an output impedance node;
   an N-channel block of transistors;
   a P-channel block of transistors;
   a first current mirror having a first input coupled to the output impedance node, a first output coupled to the P-channel block of transistors, and a second output;
   a second, parallel, current mirror having a first input coupled to the output impedance node, a first output coupled to the P-channel block of transistors, and a second output; and
   a third current mirror having an input coupled to the second outputs of the first and second current mirrors, and an output coupled to the N-channel block of transistors.

16. The output driver calibration circuit of claim 15 wherein the second current mirror further comprises an operational amplifier.

17. The output driver calibration circuit of claim 15 wherein the third current mirror further comprises an operational amplifier.

18. The output driver calibration circuit of claim 15 further comprising a load resistor coupled between the output impedance node and ground.

19. An output driver calibration circuit comprising:
   a programmable drive strength output pullup driver comprising a strongest transistor and a plurality of other transistors;
   a programmable drive strength output pulldown driver comprising a strongest transistor and a plurality of other transistors; and
   a calibration circuit for generating a plurality of control signals for controlling the transistors in the output pullup driver and the transistors in the output pulldown driver;
   an ESD protection circuit coupled to an output impedance node,
   wherein the control signals are generated simultaneously, except for the strongest driver transistors.

20. The output driver calibration circuit of claim 19 wherein the strongest transistor in the pullup driver receives a first control signal.

21. The output driver calibration circuit of claim 19 wherein the strongest transistor in the pulldown driver receives a first control signal.

22. The output driver calibration circuit of claim 19 wherein the pullup driver comprises a plurality of substantially binarily weighted P-channel transistors.

23. The output driver calibration circuit of claim 19 wherein the pulldown driver comprises a plurality of substantially binarily weighted N-channel transistors.

24. The output driver calibration circuit of claim 19 further comprising a load resistor coupled between the output impedance node and ground.

25. The output driver calibration circuit of claim 19 further comprising a load resistor coupled between the output impedance node and a positive supply voltage.

26. The output driver calibration circuit of claim 19 further comprising:
   a first current mirror coupled to the output impedance node; and
   a second, parallel, current mirror coupled to the output impedance node.

27. The output driver calibration circuit of claim 26 wherein the second current mirror comprises an operational amplifier.

28. The output driver calibration circuit of claim 19 wherein the ESD protection circuit comprises a resistor, a diode, or the parallel combination of a resistor and a diode.

* * * * *

UNITED STATES PATENT AND TRADEMARK OFFICE
CERTIFICATE OF CORRECTION

PATENT NO. : 7,782,080 B2  Page 1 of 1
APPLICATION NO. : 12/207179
DATED : August 24, 2010
INVENTOR(S) : Steve Eaton It is certified that error appears in the above-identified patent and that said Letters Patent is hereby corrected as shown below:

Column 8, line 13, after generating delete ","

Signed and Sealed this

Ninth Day of November, 2010

David J. Kappos
*Director of the United States Patent and Trademark Office*